US010158945B2

(12) United States Patent
Jung et al.

(10) Patent No.: US 10,158,945 B2
(45) Date of Patent: Dec. 18, 2018

(54) ACOUSTIC OUTPUT DEVICE AND CONTROL METHOD THEREOF

(71) Applicant: SAMSUNG ELECTRONICS CO., LTD., Suwon-si (KR)

(72) Inventors: Dong-hyun Jung, Seoul (KR); Dong-kyu Park, Hwaseong-si (KR); Yoon-jae Lee, Seoul (KR); Young-suk Song, Suwon-si (KR); Woo-jung Lee, Suwon-si (KR); Hae-kwang Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/606,646

(22) Filed: May 26, 2017

(65) Prior Publication Data

US 2018/0007468 A1 Jan. 4, 2018

(30) Foreign Application Priority Data

Jun. 30, 2016 (KR) ........................ 10-2016-0082869

(51) Int. Cl.

*H03F 3/68* (2006.01)
*H04R 3/12* (2006.01)
*H04R 1/28* (2006.01)
*H04R 3/06* (2006.01)
*H04R 3/14* (2006.01)

(Continued)

(52) U.S. Cl.

CPC ............. *H04R 3/12* (2013.01); *H04R 1/2811* (2013.01); *H04R 3/06* (2013.01); *H04R 3/14* (2013.01); *H04S 3/002* (2013.01); *H04S 5/00* (2013.01)

(58) Field of Classification Search

CPC .......... H04R 3/12; H04R 1/2811; H04R 3/06; H04R 3/14; H04S 5/00; H04S 3/002

(Continued)

(56) References Cited

U.S. PATENT DOCUMENTS 7,397,924 B2 7/2008 Praestgaard et al.
8,363,852 B2 1/2013 Bharitkar et al.

(Continued)

FOREIGN PATENT DOCUMENTS

EP 2 522 156 B1 8/2014
JP 7236194 A 9/1995

(Continued)

OTHER PUBLICATIONS

International Search Report and Written Opinion (PCT/ISA/210 & PCT/ISA/237) dated Aug. 30, 2017 issued by the International Searching Authority in counterpart International Application No. PCT/KR2017/006293.

*Primary Examiner* — Paul S Kim
*Assistant Examiner* — Ubachukwu Odunukwe
(74) *Attorney, Agent, or Firm* — Sughrue Mion, PLLC

(57) ABSTRACT

An acoustic output device and a control method thereof are provided. The acoustic output device includes: at least one first speaker configured to output a first sound range; a plurality of second speakers configured to output a second sound range that is different from the first sound range; a first crossover circuit connected to the first speaker and one of the plurality of second speakers; a second crossover circuit connected to the first speaker and another of the plurality of second speakers; and a processor configured to control the first and second crossover circuits to provide acoustic signals to the first speaker and the plurality of second speakers, wherein a frequency band of an acoustic signal provided to the first speaker connected to the first crossover circuit is at least partially different from a frequency band of an acoustic signal provided to the first speaker connected to the second of crossover circuit, and wherein a frequency band of an acoustic signal provided to the one of the plurality of second speakers connected to the second crossover circuit is at least partially different from a frequency band of an acoustic (Continued)

signal provided to the other of the plurality of second speakers connected to the second of crossover circuit.

20 Claims, 29 Drawing Sheets

(51) Int. Cl.
*H04S 5/00* (2006.01)
*H04S 3/00* (2006.01)

(58) Field of Classification Search
USPC ........................ 381/300, 18, 120, 17; 700/94
See application file for complete search history.

(56) References Cited

U.S. PATENT DOCUMENTS

| | | | |
|---|---|---|---|
| 8,477,951 B2 | 7/2013 | Jung et al. | |
| 8,553,894 B2 | 10/2013 | Berardi et al. | |
| 8,868,414 B2 | 10/2014 | Aoki et al. | |
| 2005/0096762 A2 | 5/2005 | Claesson | |
| 2005/0271215 A1* | 12/2005 | Kulkarni | H04S 5/00 381/18 |
| 2008/0101631 A1 | 5/2008 | Jung et al. | |
| 2010/0260356 A1* | 10/2010 | Teramoto | H04S 3/002 381/120 |
| 2010/0290630 A1* | 11/2010 | Berardi | H04S 3/002 381/17 |
| 2014/0093096 A1 | 4/2014 | Sheen et al. | |
| 2015/0172818 A1 | 6/2015 | Gladwin et al. | |

FOREIGN PATENT DOCUMENTS

| | | |
|---|---|---|
| JP | 2004-23512 A | 1/2004 |
| JP | 5707963 B2 | 4/2015 |
| KR | 100717066 B1 | 5/2007 |

* cited by examiner

ACOUSTIC OUTPUT DEVICE AND CONTROL METHOD THEREOF

CROSS-REFERENCE TO RELATED APPLICATIONS

This application claims priority from Korean Patent Application No. 10-2016-0082869, filed on Jun. 30, 2016 in the Korean Intellectual Property Office, the disclosure of which is incorporated herein by reference in its entirety.

BACKGROUND OF THE INVENTION

Field of the Invention

Apparatuses and methods consistent with the present disclosure relate to an acoustic output device and a control method thereof, and more particularly, to an acoustic output device capable of allocating a reproduction band to a plurality of types of speakers to output an acoustic signal and a control method thereof.

Description of the Related Art

Acoustic output devices such as a speaker used in various places such as a home, an office, and a public place have been continuously developed over the past several years.

As the performance of an acoustic output device grows better, an input audio signal has a multi-channel form in order to improve a sound quality and to form a wide sound stage.

In recent years, the acoustic output devices have been evolved from the existing separated speakers (speakers separated into Left/Right/Center, etc.) to compact and integrated type products such as a wireless speaker and a sound bar.

The number of speaker units is limited according to spatial limitations due to the miniaturization of the speaker system, and it has been difficult to overcome physical limitations of improving a sound quality and realizing a sound field effect only by signal processing. Accordingly, there is a need to reproduce a plurality of channel signals in one speaker unit with improved the sound quality.

SUMMARY OF THE INVENTION

Exemplary embodiments overcome the above disadvantages and other disadvantages not described above. Also, an exemplary embodiment is not required to overcome the disadvantages described above, and an exemplary embodiment of the present invention may not overcome any of the problems described above.

Exemplary embodiments provide an acoustic output device capable of providing multi-crossover for improving a sound quality by forming a crossover frequency for each channel in different frequency bands when the same speaker unit is used for a reproduction of a plurality of channels and a control method thereof.

According to an aspect of an exemplary embodiment, there is provided an acoustic output device including: at least one first speaker configured to output a first sound range, a plurality of second speakers configured to output a second sound range that is different from the first sound range, a first crossover circuit connected to the first speaker and one of the plurality of second speakers, a second crossover circuit connected to the first speaker and another of the plurality of second speakers, and a processor configured to control the first and second crossover circuits to provide acoustic signals to the first speaker and the plurality of second speakers, wherein a frequency band of an acoustic signal provided to the first speaker connected to the first crossover circuit is at least partially different from a frequency band of an acoustic signal provided to the first speaker connected to the second of crossover circuit, and wherein a frequency band of an acoustic signal provided to the one of the plurality of second speakers connected to the second crossover circuit is at least partially different from a frequency band of an acoustic signal provided to the other of the plurality of second speakers connected to the second crossover circuit.

At least two of the acoustic signals reproduced by the plurality of second speakers may be configured to output acoustic signals have different frequency bands.

The plurality of second speakers may be configured to output acoustic signals of different channels.

The first speaker may be configured to output acoustic signals of a plurality of channels corresponding to each of the plurality of second speakers.

The first crossover circuit is connected to the first speaker and a second speaker among the plurality of second speakers that reproduces a first channel among the plurality of channels, and configured to divide an acoustic signal of the first channel by a reproduction range and the second crossover circuit is connected to the first speaker and a second speaker among the plurality of second speakers that reproduces a second channel among the plurality of channels, and configured to divide an acoustic signal of the second channel by the reproduction range, and the processor may be configured to control the first and second crossover circuits so that the second speaker that reproduces the second channel reproduces a frequency band wider than a frequency band reproduced by the second speaker that reproduces the first channel.

A second speaker among the plurality of second speakers that reproduces a first channel among the plurality of channels and a second speaker among the plurality of second speakers that reproduces a second channel among the plurality of channels may have different structures.

The second speaker that reproduces the second channel may include a speaker unit that includes a horn, and the second speaker that reproduces the first channel may include speaker unit that does not include a horn, and the processor may be configured to control the second speaker that reproduces the second channel to reproduce a frequency band that is wider than a frequency band of the second speaker that reproduces the first channel.

The processor may be configured to control the first crossover circuit to provide a first frequency band of the first channel to the first speaker and provide frequency bands other than the first frequency band to one of the plurality of second speakers, and control the second crossover circuit to provide a second frequency band of the second channel to the first speaker and provide frequency bands other than the second frequency band to another one of the plurality of second speakers, and the first frequency band is at least partially different from the second frequency band.

The first speaker may include a midrange speaker that are configured to output an acoustic signal having an intermediate frequency band, and the plurality of second speakers comprise a plurality of tweeters that are configured to output an acoustic signal having a high frequency band. The processor may be configured to control the first crossover circuit to provide at least one intermediate frequency band of left and right channels to the first speaker and provide a high frequency band to one of the plurality of second speakers, and control the second crossover circuit to provide an intermediate frequency band of a center channel to the first speaker and provide the high frequency band to another one of the plurality of second speakers, and the high frequency band of at least one of the left and right channels may be at least partially different from the high frequency band of the center channel.

A second speaker among the plurality of second speakers that reproduces a first channel among the plurality of channels and a second speaker among the plurality of second speakers that reproduces a second channel among the plurality of channels may have a same structure, and the processor may be configured to control the first crossover circuit and the second crossover circuit so that each of the second speaker that reproduces the first channel and the second speaker that reproduces the second channel reproduce different frequency bands based on an effective upper bound frequency at which each of beam signals corresponding to the first channel and the second channel maintains preset first and second directivities.

According to an aspect of another exemplary embodiment, there is provided a control method of an acoustic output device including: at least one first speaker configured to output a first sound range, a plurality of second speakers configured to output a second sound range that is different from the first sound range, a first crossover circuit connected to the first speaker and one of the plurality of second speakers, and a second crossover circuit connected to the first speaker and another of the plurality of second speakers, the control method comprising: receiving an input signal; controlling the first and second crossover circuits to provide acoustic signals to the first speaker and the plurality of second speakers; and reproducing the acoustic signals by the first speaker and the plurality of second speakers, wherein a frequency band of an acoustic signal provided to the first speaker connected to the first crossover circuit is at least partially different from a frequency band of an acoustic signal provided to the first speaker connected to the second of crossover circuit, and wherein a frequency band of an acoustic signal provided to the one of the plurality of second speakers connected to the second crossover circuit is at least partially different from a frequency band of an acoustic signal provided to the other of the plurality of second speakers connected to the second crossover circuit.

The acoustic signals reproduced by the plurality of second speakers output may have different frequency bands.

The acoustic signals reproduced by the plurality of second speakers may be acoustic signals of different channels.

The acoustic signals reproduced by the first speaker may be acoustic signals of a plurality of channels corresponding to the plurality of second speakers.

The plurality of crossover circuits may include: a first crossover circuit connected to the first speaker and a second speaker among the plurality of second speakers that reproduces a first channel among the plurality of channels to divide an acoustic signal of the first channel by a reproduction range; and a second crossover circuit connected to the first speaker and a second speaker among the plurality of second speakers that reproduces a second channel among the plurality of channels to divide an acoustic signal of the second channel by the reproduction range, and the controlling the plurality of crossover circuits may include controlling the first and second crossover circuits so that a frequency band reproduced by the second speaker that reproduces the second channel reproduces that is wider than a frequency band reproduced by the second speaker that reproduces the first channel.

The second speaker that reproduces the first channel among the plurality of second speakers and the second speaker that reproduces the second channel may have different structures.

The second speaker that reproduces the second channel may include a speaker unit including a horn and the second speaker that reproduces the first channel comprises a speaker unit that does not include the horn, and the controlling of the plurality of crossover circuits may include controlling the second speaker that reproduces the second channel to reproduce a frequency band wider than a frequency band reproduce by the second speaker that reproduces the first channel.

The controlling the first and second circuits may include controlling the first crossover circuit to provide a first frequency band of the first channel to the first speaker and provide frequency bands other than the first frequency band to one of the plurality of second speakers, and controlling the second crossover circuit to provide a second frequency band of the second channel to the first speaker and provide frequency bands other than the second frequency band to another one of the plurality of second speakers, and the first frequency band may be at least partially different from the second frequency band.

The first speaker may include a midrange speaker that outputs an acoustic signal of an intermediate frequency band, and the plurality of second speakers may include a plurality of tweeters that output an acoustic signal of a high frequency band, the controlling of the plurality of crossover circuits may include controlling the first crossover circuit to provide at least one intermediate frequency band of left and right channels to the first speaker and provide a high frequency band to one of the plurality of second speakers, and controlling the second crossover circuit to provide an intermediate frequency band of a center channel to the first speaker and transmit the high frequency band to another one of the plurality of second speakers, and the high frequency band of at least one of the left and right channels may be at least partially different from the high frequency band of the center channel.

A second speaker among the plurality of second speakers that reproduces a first channel among the plurality of channels and a second speaker among the plurality of second speakers that reproduces a second channel among the plurality of channels may have a same structure, and the controlling of the first and second crossover circuits may include controlling the plurality of crossover circuits so that the second speakers that reproduce the first and second channels reproduce different frequency bands based on an effective upper bound frequency at which each of beam signals corresponding to the first channel and the second channel maintains preset first and second directivities.

BRIEF DESCRIPTION OF THE DRAWING FIGURES

The above and/or other aspects will be more apparent by describing certain exemplary embodiments with reference to the accompanying drawings, in which:

FIG. 1 is a diagram illustrating one implementation example of an acoustic output device according to an exemplary embodiment;

FIGS. 2A, 2B, and 2C are diagrams for explaining the relationship between a reproduction band of a speaker and a size of a diaphragm of the speaker for better understanding;

Figure 12:
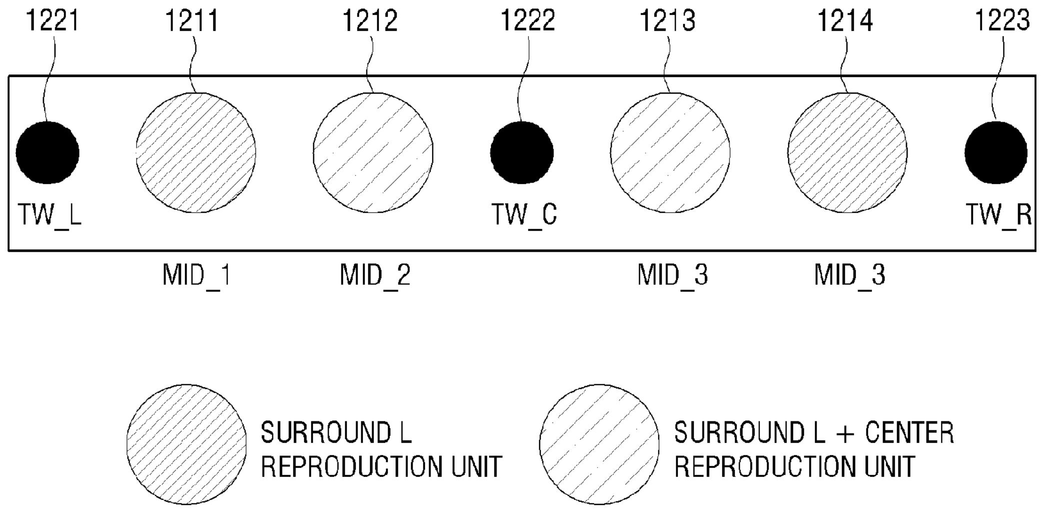
Figure 13A:
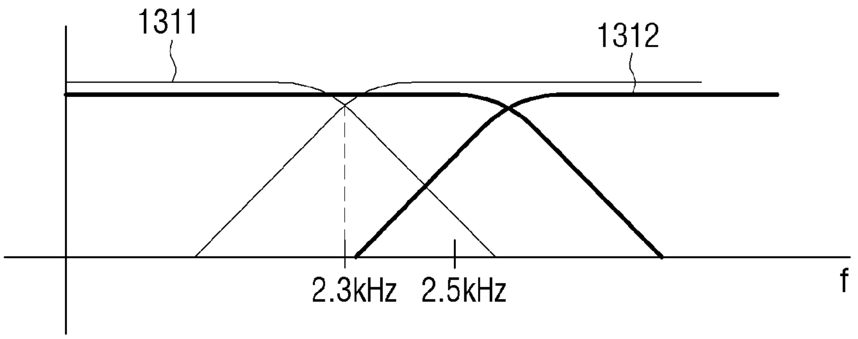
Figure 13B:
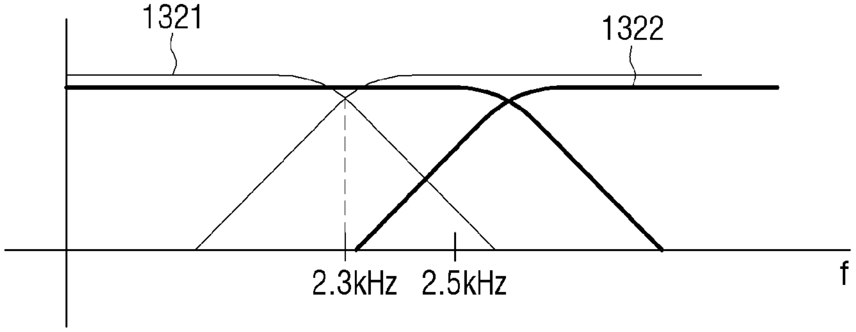
Figure 14:
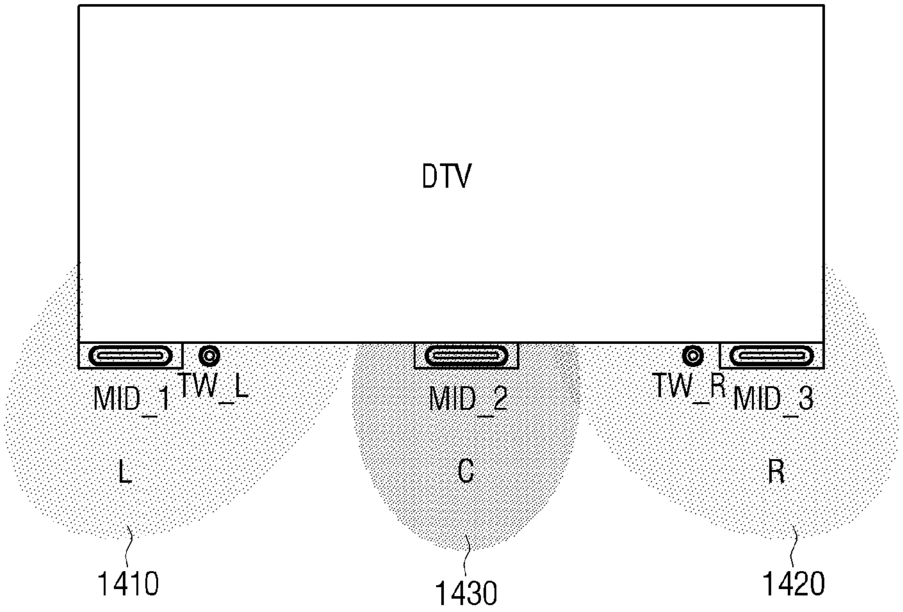
Figure 15:
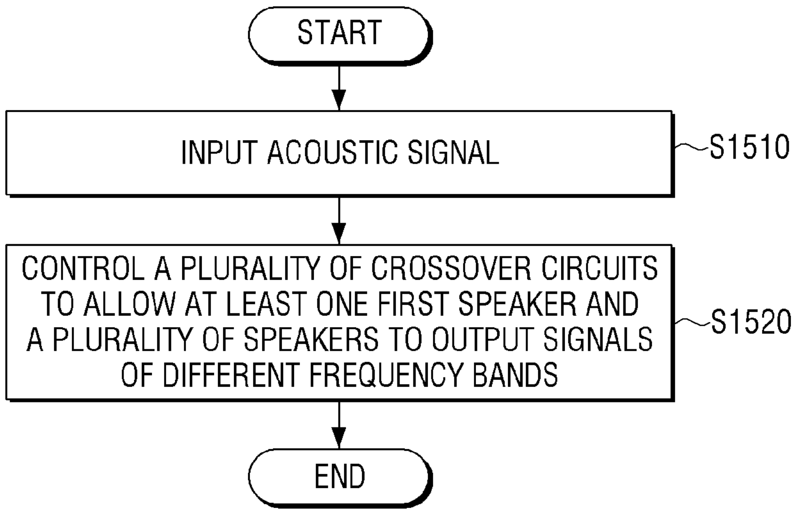

FIGS. 12, 13A, and 13B are diagrams for explaining an operation of an acoustic output device according to another exemplary embodiment;

FIG. 14 is a diagram for explaining a case in which the acoustic output device according to another exemplary embodiment is implemented as a digital TV; and FIG. 15 is a flow chart for explaining a control method of an acoustic output device according to an exemplary embodiment.

DETAILED DESCRIPTION OF EXEMPLARY EMBODIMENTS

Hereinafter, various exemplary embodiments will be described in detail with reference to the accompanying drawings.

Figure 1:
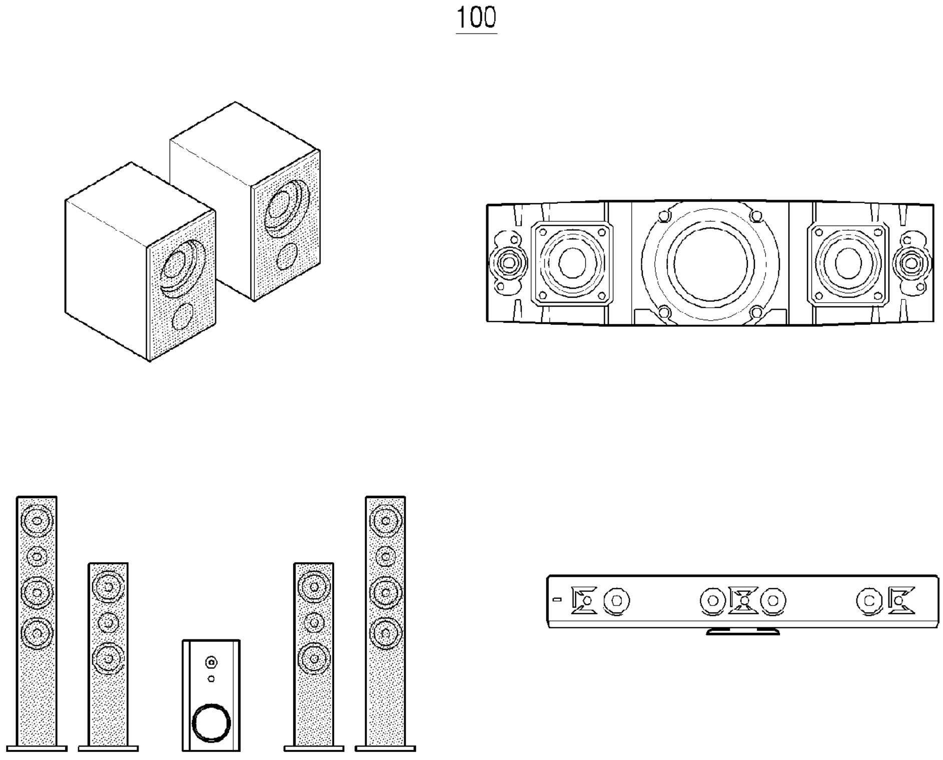

FIG. 1 is a diagram illustrating one implementation example of an acoustic output device according to an exemplary embodiment.

Referring to FIG. 1, an acoustic output device 100 includes a plurality of speaker units and may be implemented as a sound bar, a home theater system, a one box speaker, a room speaker, etc. However, as long as the acoustic output device 100 includes a plurality of speaker units, it may be applied without being limited. For example, the acoustic output device may be implemented as a user terminal device, a smart television (TV), an audio device, or the like, which have a plurality of speaker units.

A plurality of speaker units configuring the acoustic output device 100 serve to convert an electric pulse into a sound wave and may be implemented as an electro-dynamic type, that is, a dynamic type which is classified according to a principle and a method of converting an electric signal into a sound wave. However, embodiments of the acoustic output device are not limited thereto and therefore may be implemented as an electrostatic type, a dielectric type, a magnetostrictive type, or the like within the scope to which the present disclosure is applied.

In addition, the acoustic output device 100 may be implemented in a multi-way system in which a range of the reproduction band is divided into low, middle, and high ranges, and the divided ranges are allocated to appropriate speaker units. For example, in the case of a three-way system in which the reproduction band is shared between three types of speakers, a plurality of speaker units may be implemented by at least one tweeter reproducing a high frequency acoustic signal, at least one midrange speaker reproducing an intermediate frequency acoustic signal, at least one woofer reproducing a low frequency acoustic signal, and the like. As another example, the two-way system that allocates the reproduction band to two types of speakers may also be implemented in a form including the tweeter and the midrange speaker.

Figure 2A:
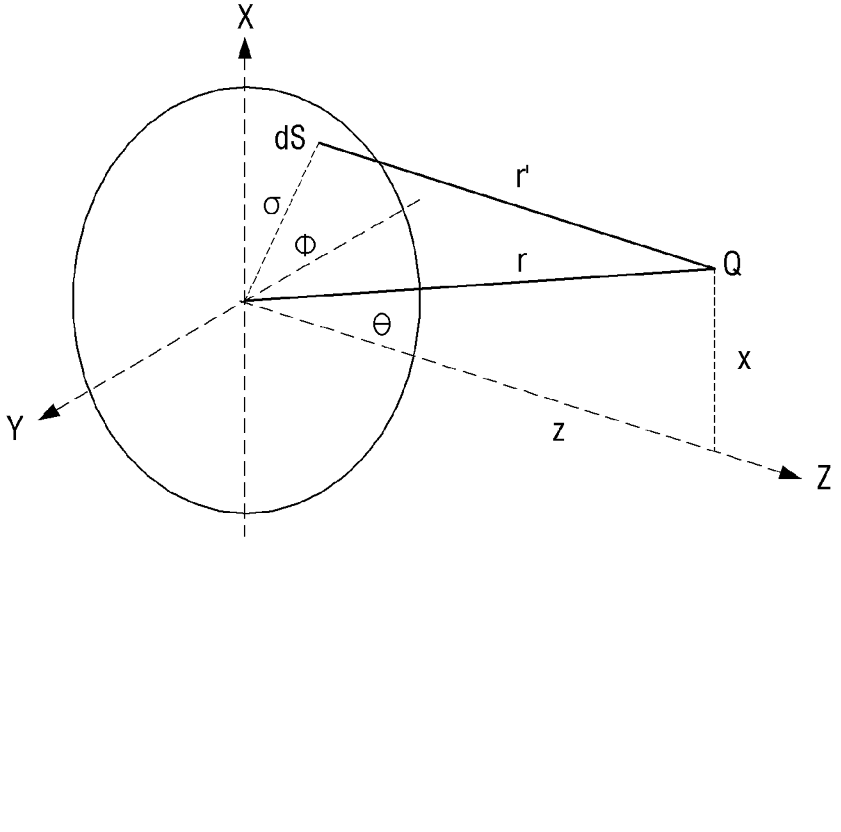
Figure 2B:
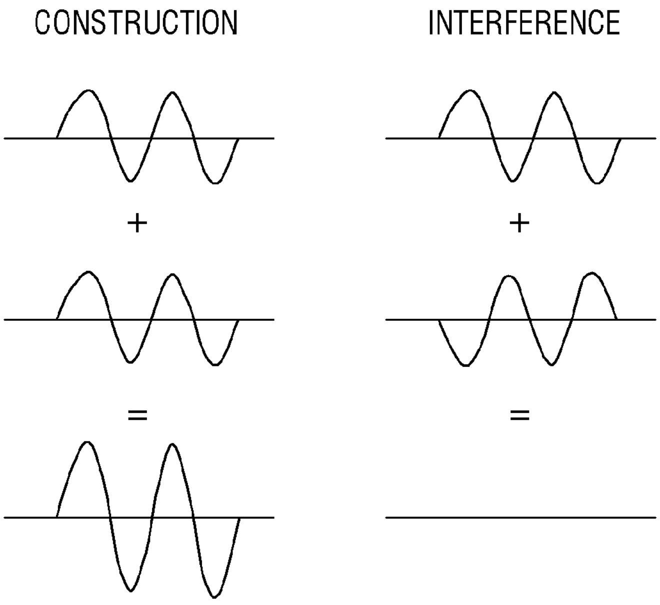

FIGS. 2A and 2B are diagrams for explaining the relationship between a reproduction band of a speaker and a size of a diaphragm of the speaker for better understanding.

As illustrated in FIGS. 2A and 2B, if it is assumed that the speaker is a sound source whose diaphragm is a flat plate, a sound pressure at point Q is represented by the sum of sound pressures of several minute areas dS of the flat plate. At this point, a difference between transfer paths of r and r' occurs, which results from reinforcement and interference of a signal. Here, characteristics of the construction and interference are more greatly exhibited in a high frequency band having a shorter wavelength than in a low frequency band having a relatively longer wavelength.

Accordingly, there is an optimized frequency domain that matches the area and characteristics of the diaphragm of the speaker. For example, in the case of the high frequency band, a narrow sweet spot is formed due to a poor directivity when a wide diaphragm is used and decay and response characteristics of the diaphragm deteriorate, which is a cause of decreased sound clarity. Therefore, a diaphragm having a small diameter is typically used. Further, in the case of the low frequency band, a large dynamic range is required when a narrow diaphragm is used, which is a cause of limited reproduction and distortion of sound. Therefore, a diaphragm having a large diameter is typically used.

Figure 2C:
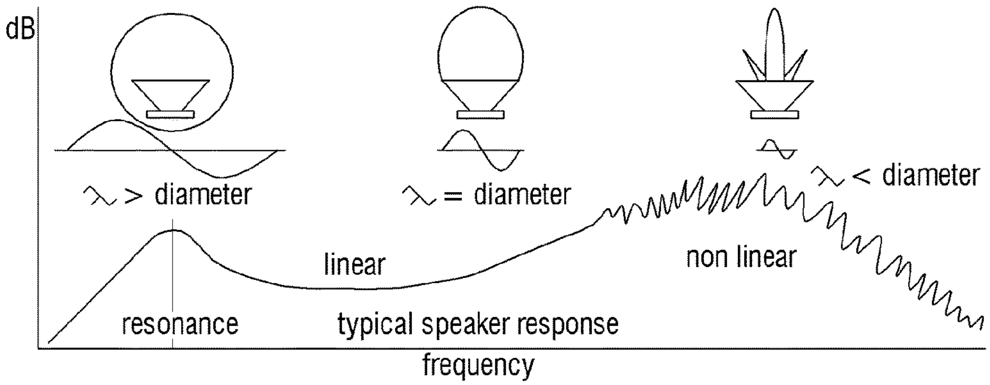

As a result, as illustrated in FIG. 2C, in order to maximize efficiency when the acoustic output device 100 reproduces the entire audio frequency band (for example, 20 Hz to 20 kHz), the acoustic output device 100 applies a crossover to reproduce only a frequency band corresponding to each speaker unit. For example, in terms of the area of the diaphragm, the diaphragm is designed so that a wavelength of a lower bound frequency that is effective for reproduction is 10 times as large as the diameter of the diaphragm and an upper bound frequency that is effective for reproduction meets the diameter of the diaphragm.

According to an exemplary embodiment, a plurality of speakers may be implemented to provide a left (L) channel, a right (R) channel, and a center (C) channel like a 5.1 audio and a 7.1 audio. For example, in the case of supporting the 5.1 audio, the C channel, a front L channel, a front R channel, a rear L channel, and a rear channel may be provided.

In particular, according to the exemplary embodiment, when a range of an acoustic reproduction band is divided into low, middle, and high ranges, at least one speaker responsible for a specific reproduction band may reproduce at least two channels. For example, at least one midrange speaker may be used to reproduce the L channel, the R channel, and the C channel or the L/R channels.

Figure 3A:
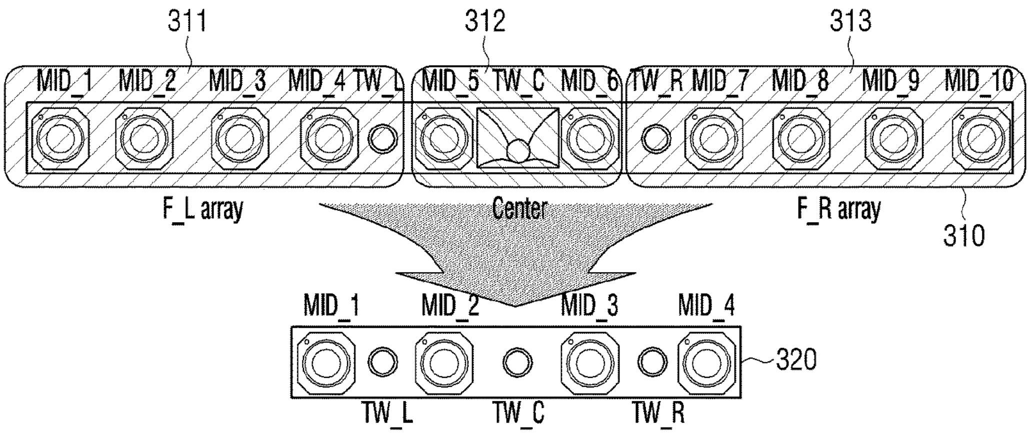
FIGS. 3A and 3B are diagrams for describing the implementation example of the acoustic output device according to the exemplary embodiment.

That is, as illustrated in FIG. 3A, in order to produce a sound field effect in a typical acoustic system 310, speaker units responsible for reproduction by the channel are required and speaker arrays 311, 312, and 313 for each channel are configured, thereby providing even wider sound field effect. However, when the speaker arrays for each channel are provided, a large space is occupied and a large number of speaker units are required. Therefore, according to the exemplary embodiment, one speaker unit reproduces a plurality of channels, thereby reducing the occupied space, the number of speakers, and costs.

As an example, as illustrated in a lower portion of FIG. 3A, the tweeter unit reproducing the high frequency band includes tweeters TW_L, TW_R, and TW_C reproducing the high frequency band of each channel for L/R/C and the midrange unit may include midrange speakers MID_1, MID_2, MID_3, and MID_4 reproducing at least two channels. However, in the case of the three-way system, the woofer responsible for the low frequency band may be separately provided inside or outside an acoustic output device 320.

Figure 3B:
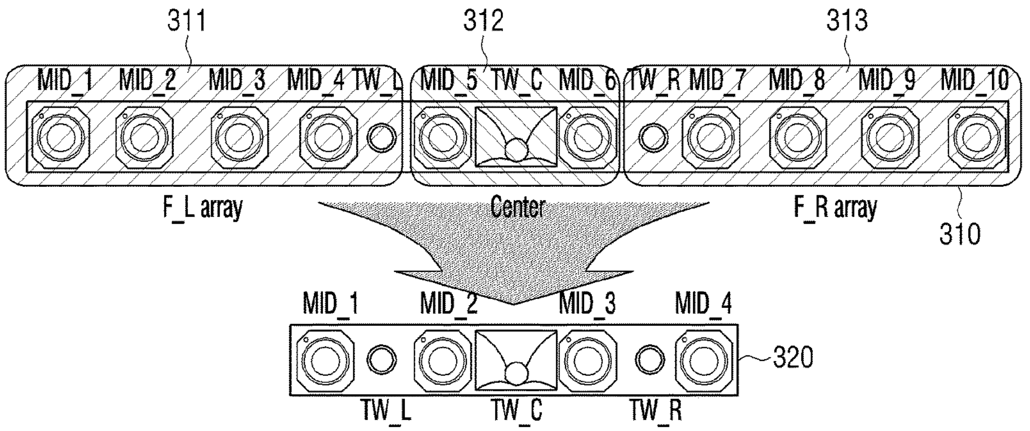

According to an exemplary embodiment, a multi-crossover having a crossover frequency in different bands by the channel may be provided to maximize the sound field effect for each channel. For this purpose, as illustrated in FIG. 3B, the TW_L and the TW_R are the typical speaker unit, and the TW_C may be implemented in a form including a structure in which a passive directivity is assigned to the speaker unit, for example, a horn. In this case, it is possible to provide the multi-crossover using characteristics of the horn. However, according to another exemplary embodiment, the TW_L, the TW_R, and the TW_C may all have the same structure, for example, may be the typical speaker unit without a horn. In this case, the multi-crossover may be provided using a beam forming technology.

Hereinafter, various exemplary embodiments for providing a multi-crossover will be described in detail with reference to the drawings.

Figure 4A:
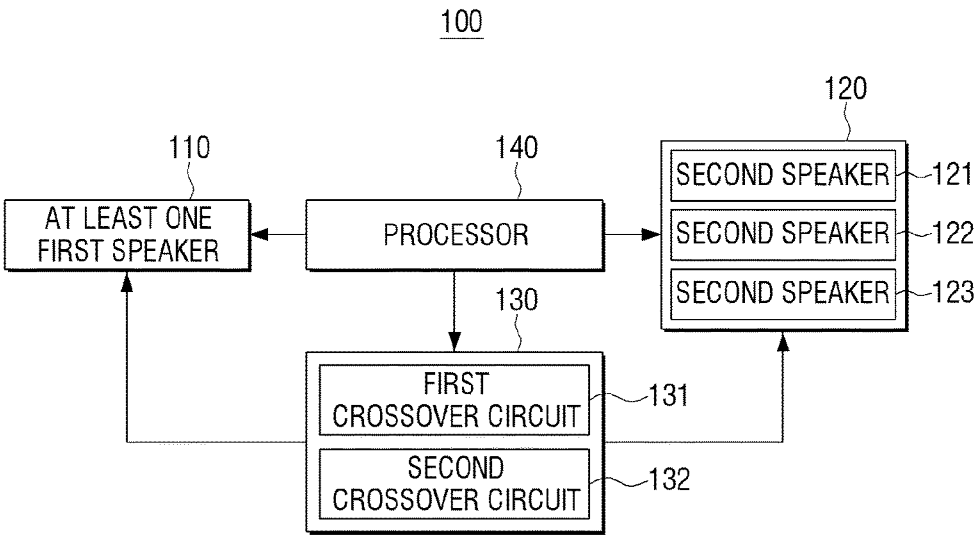
FIGS. 4A to 4E are views for explaining a configuration of the acoustic output device according to the exemplary embodiment.

FIG. 4A is a block diagram illustrating a configuration of an acoustic output device according to an exemplary embodiment.

Referring to FIG. 4A, the acoustic output device 100 includes at least one first speaker 110, a plurality of second speakers 120, a plurality of crossover circuits 130, and a processor 140. Here, the acoustic output device 100 may be implemented as a sound bar in which a plurality of speaker units are arranged in a bar shape, but is not limited thereto. For example, the acoustic output device 100 may be implemented as a surround sound system, or the like which is one component of a home theater system. That is, when the acoustic output device 100 is implemented as the surround sound system of the home theater system, a plurality of first speakers 110 and a plurality of second speakers 120 may be implemented as multi-channel speakers which are installed to be spaced apart from each other at appropriate locations in an acoustic providing space (for example, in a room).

At least one first speaker 110 outputs (or reproduces) an acoustic signal of a specific range. For example, at least one first speaker 110 may output an acoustic signal of a middle range, that is, an intermediate frequency band.

The plurality of second speakers 120 output a sound range different from a sound range of the first speaker 110. For example, the plurality of second speakers 120 may output a sound range that is higher than a sound range output from the first speaker 110. For example, when at least one first speaker 110 outputs the middle range, the plurality of second speakers 120 may output the acoustic signal of the high range, that is, the high frequency band. In this case, the plurality of second speakers 120 may output acoustic signals having at least some different frequency bands. Alternatively, the plurality of second speakers 120 may output the acoustic signal of the same frequency band.

In addition, the plurality of second speakers 120 each output acoustic signals of different channels.

For example, according to an exemplary embodiment, when the plurality of second speakers 120 are implemented as three tweeters, the plurality of second speakers 121, 122, and 123 may each output the high ranges of different channels, for example, the L channel, the R channel, and the C channel.

At least one first speaker 110 outputs acoustic signals of a plurality of channels corresponding to the plurality of second speakers 120, respectively. That is, at least one first speaker 110 may output acoustic signals of different channels together with the plurality of second speakers 120. For example, at least one first speaker 110 may reproduce the L channel together with the second speaker 121 responsible for the L channel, at least one first speaker 110 may reproduce the R channel together with the second speaker 122 responsible for the R channel, and at least one first speaker 110 may reproduce the C channel together with the second speaker 123 responsible for the C channel.

The plurality of crossover circuits 130 (or crossover filters) are connected to at least one first speaker 110 and each of the plurality of second speakers 120. Here, the crossover circuit may be implemented as at least one of a passive crossover that is an electrical filter passing only a specific frequency using a capacitor or a coil and an active crossover that is a crossover divider network device receiving an output of a head unit and dividing and providing an output of reproduction signals by the reproduction signal band to power amplifiers by the reproduction band.

More specifically, the plurality of crossover circuits 130 comprises a first crossover circuit connected to the first speaker and one of the plurality of second speakers, and a second crossover circuit connected to the first speaker and another of the plurality of second speakers.

For example, the first crossover circuit 131 of the plurality of crossover circuits 130 may be connected to at least one first speaker 110 and one second speaker 121 or 122 and a second crossover circuit 132 may be connected to at least one first speaker 110 and another second speaker 123. Here, each of the plurality of crossover circuits 131 and 132 serves to divide the acoustic signal by the reproduction range. That is, the plurality of crossover circuits act as a filter and pass only a signal of a specific frequency band and transmit the signal to the corresponding speaker.

Specifically, the first crossover circuit 131 may divide the acoustic signal of the first channel of the plurality of channels by the reproduction range and transmit the acoustic signals by the divided range to the at least one first speaker 110 and one second speaker 121 or 122, respectively. Further, the second crossover circuit 132 may divide the acoustic signal of the second channel of the plurality of channels by the reproduction range and transmit the acoustic signals by the divided range to the at least one first speaker 110 and another second speaker 123, respectively.

In this case, the crossover frequency of the first channel between the first speaker 110 and one second speaker 121 or 122 and the crossover frequency of the second channel between the first speaker 110 and another second speaker 123 may be different. Here, the crossover frequency means a frequency band in which a sound source is separated through a crossover circuit.

The processor 140 controls the overall operation of the acoustic output device 100. Here, the processor 140 may include one or more of a central processing unit (CPU), a controller, an application processor (AP), a communication processor (CP), and an ARM processor.

The processor 140 may control the plurality of crossover circuits 130 so that at least one first speaker 110 and the plurality of second speakers 120 each output signals of at least some different frequency bands. The processor 140 may control the first and second crossover circuits to provide acoustic signals to the first speaker and the plurality of second speakers. In this case, a frequency band of an acoustic signal provided to the first speaker connected to the first crossover circuit is at least partially different from a frequency band of an acoustic signal provided to the first speaker connected to the second of crossover circuit, and a frequency band of an acoustic signal provided to the one of the plurality of second speakers connected to the second crossover circuit is at least partially different from a frequency band of an acoustic signal provided to the other of the plurality of second speakers connected to the second crossover circuit.

Specifically, the processor 140 may control the first crossover circuit 131 of the plurality of crossover circuits 130 to transmit the first frequency band of the first channel to the first speaker 110 and transmit a frequency band other than the first frequency band to one second speaker 121 or 122 of the plurality of second speakers. Further, the processor 140 may control the second crossover circuit 132 of the plurality of crossover circuits 130 to transmit the second frequency band of the second channel to the first speaker and transmit a frequency band other than the second frequency band to another second speaker 123 of the plurality of second speakers. In this case, the first and second frequency bands may be at least partially different and the first crossover frequency of the first channel and the crossover frequency of the second channel may be formed in different frequency bands. However, in some cases, the first crossover frequency of the first channel and the crossover frequency of the second channel may be formed in least partially the same frequency band.

For example, when the plurality of crossover circuits 130 are implemented as the first and second crossover circuits 131 and 132 that are passive crossover circuits that electrical filter pass only the specific frequency using the capacitors or the coil, the processor 140 may control to pass the first channel signal through the first crossover circuit 131 that divides the reproduction band into the first and third frequency bands and perform to pass the second channel signal through the second crossover circuit 132 that divides the reproduction band into second and fourth frequency bands.

The at least one first speaker 110 is implemented as at least one midrange speaker that outputs the acoustic signal of the intermediate frequency band and the plurality of second speakers 120 may be implemented as the plurality of tweeters that output the acoustic signal of the high frequency band. In this case, the processor 140 may control the first crossover circuit 131 to transmit the intermediate frequency band of at least one of the left (L) and right (R) channels to the first speaker 110 and transmit a high frequency band of at least one of the left (L) and right (R) channels to one second speaker 121 or 122 of the plurality of second speakers and control the second crossover circuit 132 to transmit the intermediate frequency band of the C channel to the first speaker 110 and transmit the high frequency band of the C channel to another second speaker 123 of the plurality of second speakers. In this case, the high frequency bands output from one second speaker 121 or 122 of the plurality of second speakers and the other second speaker 123 may be at least partially different, and as a result the intermediate frequency bands of the first and second channels output from the first speaker 110 may be at least partially different.

As described above, the processor 140 may control the plurality of crossover circuits 130 to form the crossover frequency for the first channel and the crossover frequency for the second channel in different frequency bands.

Figure 4B:
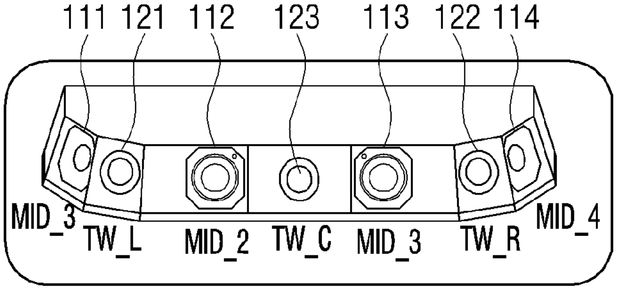

According to one exemplary embodiment, as illustrated in FIG. 4B, at least one first speaker 110 may be implemented as four midrange speakers 111, 112, 113, and 114 that output the intermediate frequency acoustic signals and the plurality of second speakers 120 may be implemented as three tweeters 121, 122, and 123 that output the high frequency acoustic signal. In this case, all of the four midrange speakers 111, 112, 113, and 114 and the tweeter 121 of the three tweeters 121, 122, and 123 reproduce the L channel and all of the four midrange speakers 111, 112, 113 and 114 and the tweeter 122 of the three tweeters 121, 122 and 123 may reproduce the R channel. In addition, two first speakers 112 and 113 of the four midrange speakers and the tweeter 123 of the three tweeters may reproduce the C channel.

In this case, the processor 140 may control the two first speakers 112 and 113 used for the reproduction of all the L/R/C channels to form, in different frequency bands, the first crossover frequency in which the middle range and the high range of the L/R channels are crossed and the second crossover frequency in which the middle range and the high range of the C channel are crossed.

According to one exemplary embodiment, the second speaker 121 or 122 reproducing the first channel (for example, L/R channels) and the second speaker 123 reproducing the second channel (for example, C channel) may be implemented as speaker units having different structures. For example, the second speaker 123 reproducing the second channel (for example, C channel) may be implemented to have an effective frequency band wider than that of the second speaker 121 or 122 reproducing the first channel (for example, L/R channels).

Accordingly, the processor 140 may control the plurality of crossover circuits 130 to form the first crossover frequency in a fifth frequency band for the first channel (e.g., L/R channels) and the second crossover frequency in a sixth frequency band lower than the fifth frequency band for the second channel (e.g., C channel).

According to another exemplary embodiment, the second speaker 123 reproducing the first channel (for example, C channel) is implemented as the speaker unit having the structure having the passive directivity, for example, the horn, and the second speaker reproducing the second channel (for example, L/R channels) may be implemented as the typical speaker unit without the horn.

Figure 4C:
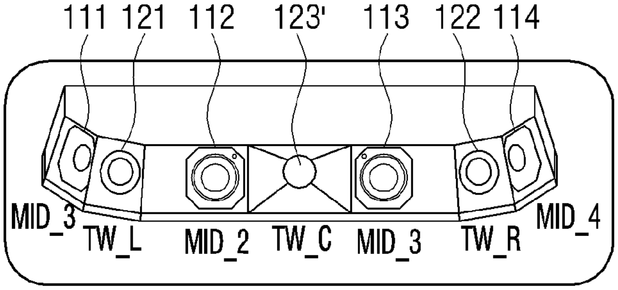

For example, as illustrated in FIG. 4C, a tweeter 123' reproducing the C channel among the three tweeters 121, 122 and 123' may be implemented as the speaker unit including the horn and the tweeters 121 and 122 reproducing the L and R channels may be implemented as the typical speaker unit without the horn.

In this case, since the effective frequency band of the tweeter 123', that is, the reproduction band that may be reproduced through the tweeter 123' is expanded by an amplification effect of the horn included in the tweeter 123' reproducing the C channel, the processor 140 may use the tweeter 123' reproducing the C channel up to the frequency band lower than that of the tweeters 121 and 122 reproducing the L/R channels. Accordingly, the processor 140 may form, for the C channel, the crossover frequency in the second frequency band lower than the first frequency band in which the crossover frequencies of the L/R channels are formed.

That is, the processor 140 may lower the crossover frequency of the C channel using the characteristics of the horn. Hereinafter, a method of providing a multi-crossover using characteristics of the horn will be described in detail.

The horn has the passive directivity and has a feature that shows certain directed radiation characteristics according to a frequency. For example, there is the feature that the directivity is narrowed for the intermediate frequency and low frequency acoustic signals and the directivity is widened for the high frequencies. In addition, the horn has the effect of amplifying the sound pressure, thereby ensuring the dynamics and improving the sound clarity.

Figure 5A:
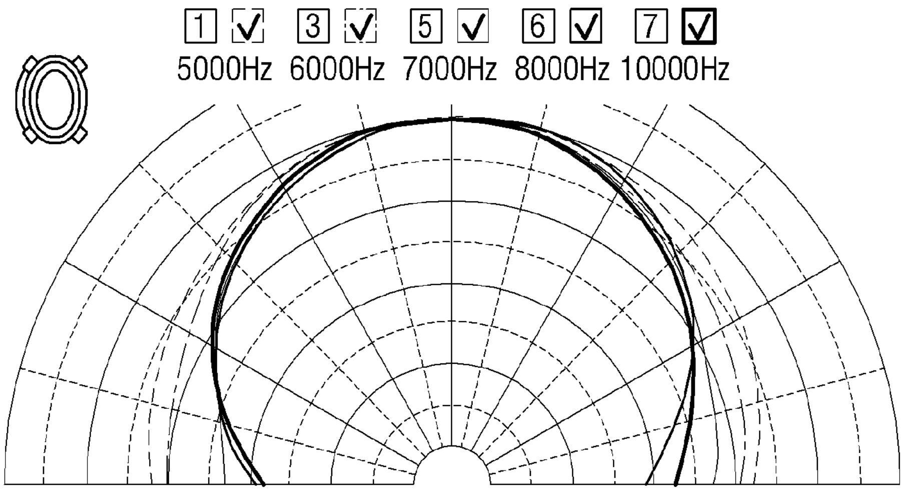
FIGS. 5A and 5B are diagrams for explaining radiation directivities of a typical speaker unit and a speaker unit including a horn according to an exemplary embodiment.
Figure 5B:
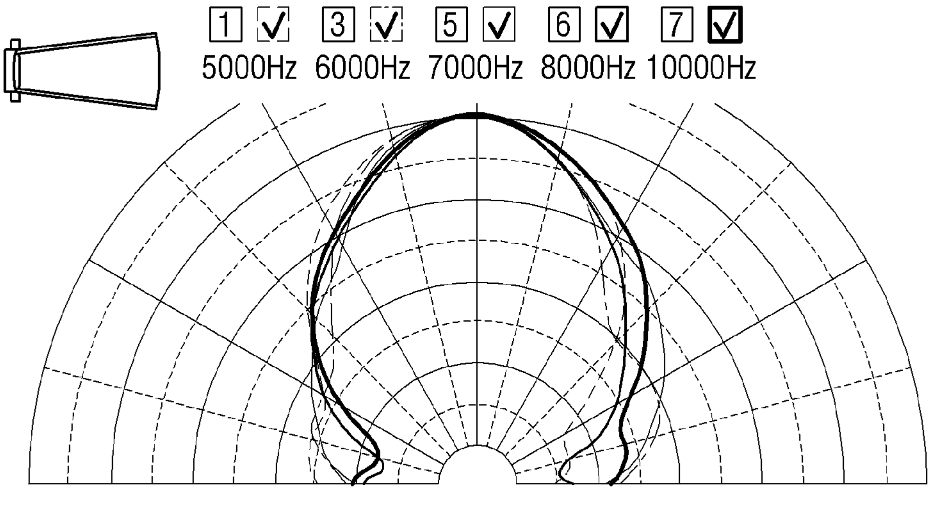

As illustrated in FIG. 5A, the directivity in which the typical speaker unit is radiated shows wider characteristics toward a low frequency, whereas as illustrated in FIG. 5B, the directivity in which the speaker unit including the horn is radiated is constant according to a change in frequency.

Figure 6:
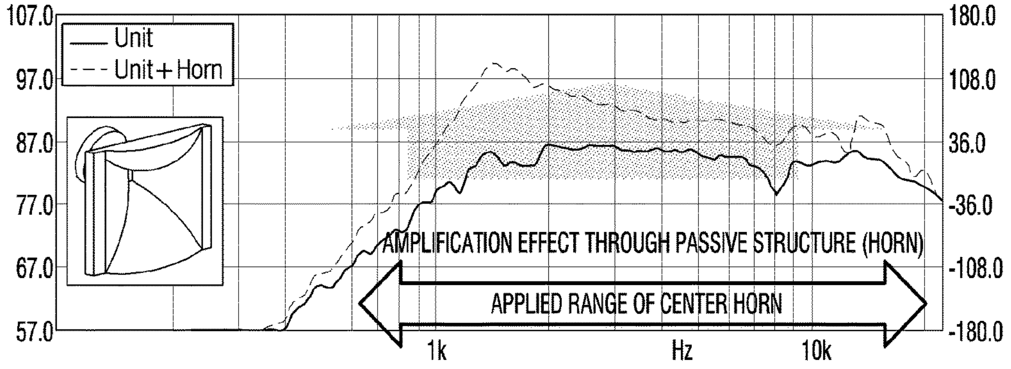
FIG. 6 is a diagram for explaining frequency characteristics of the typical speaker unit and the speaker unit including the horn according to the exemplary embodiment.

FIG. 6 is a diagram for explaining frequency characteristics of the typical speaker unit and the speaker unit including the horn according to the exemplary embodiment.

According to the exemplary embodiment illustrated in FIG. 6, when the same acoustic signal is reproduced by the typical speaker unit and the speaker unit including the horn, the frequency characteristics measured at 1 m ahead are shown.

As illustrated in FIG. 6, the speaker including the horn has the effect of amplifying the sound pressure in the frequency band of 1 kHz or more. That is, in the case of the speaker including the horn, in order to show the same output compared with the typical speaker, the size of the signal input to the speaker is reduced and the distortion of the sound is reduced.

Further, the effect of expanding the effective frequency band of the tweeter 123 due to the amplification effect by the horn is shown. Accordingly, it is possible to overcome the limitation of the narrow reproduction frequency band and the low sound pressure of the tweeter by applying the horn to the low-cost, low-performance tweeter (for example, tweeter unit).

Figure 7A:
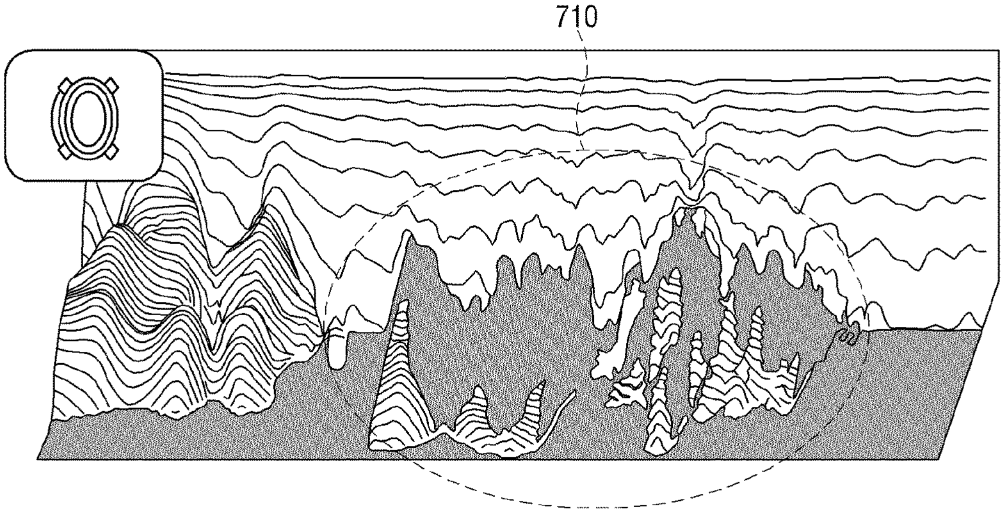
FIGS. 7A and 7B are diagrams for explaining decay characteristics of the typical speaker unit and the speaker unit including the horn according to the exemplary embodiment.
Figure 7B:
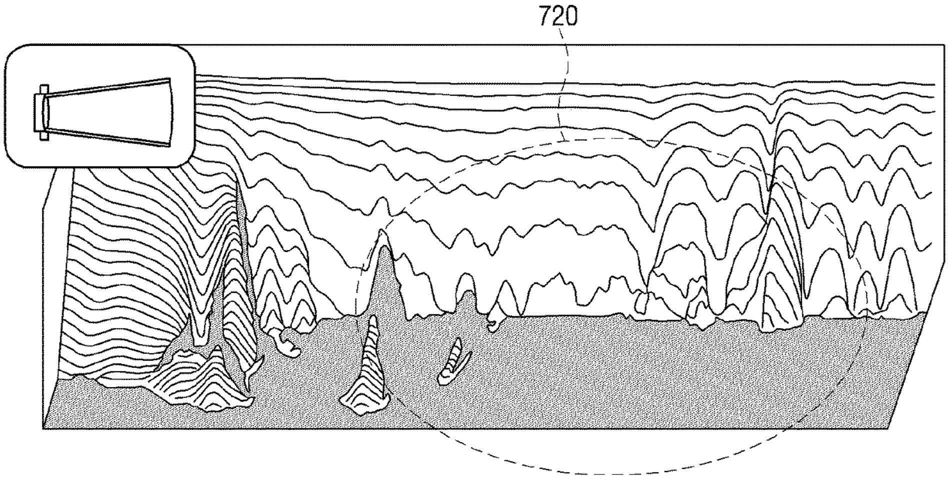

FIGS. 7A and 7B are diagrams for explaining decay characteristics of the typical speaker unit and the speaker unit including the horn according to the exemplary embodiment.

FIGS. 7A and 7B are graphs illustrating decay characteristics for a frequency domain of 1 kHz to 20 kHz according to an exemplary embodiment, and based on the graphs of FIGS. 7A and 7B, the time or the shape in which the sound of the corresponding frequency component is reproduced and converged may be analyzed.

Reviewing the frequency domain from 3 kHz to 10 kHz shown by a dotted line in FIGS. 7A and 7B, it may be confirmed that fast convergence characteristics are shown at a short decay time when the horn is provided. Like the case in which the horn is provided, as the decay time becomes faster, harmonic components and sound interference may be avoided, and therefore the sound clarity may be improved.

Figure 8A:
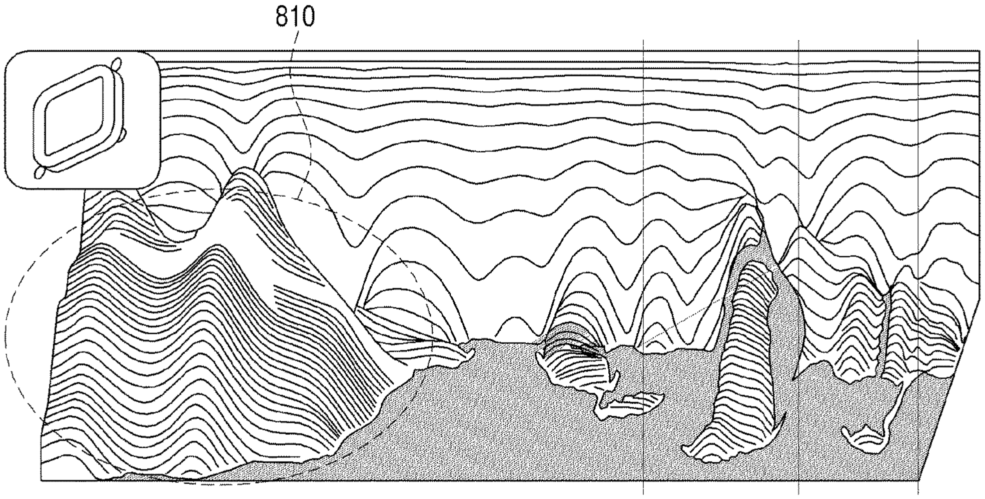
FIGS. 8A and 8B are diagrams for explaining decay characteristics of a midrange speaker and a tweeter including a horn according to an exemplary embodiment.
Figure 8B:
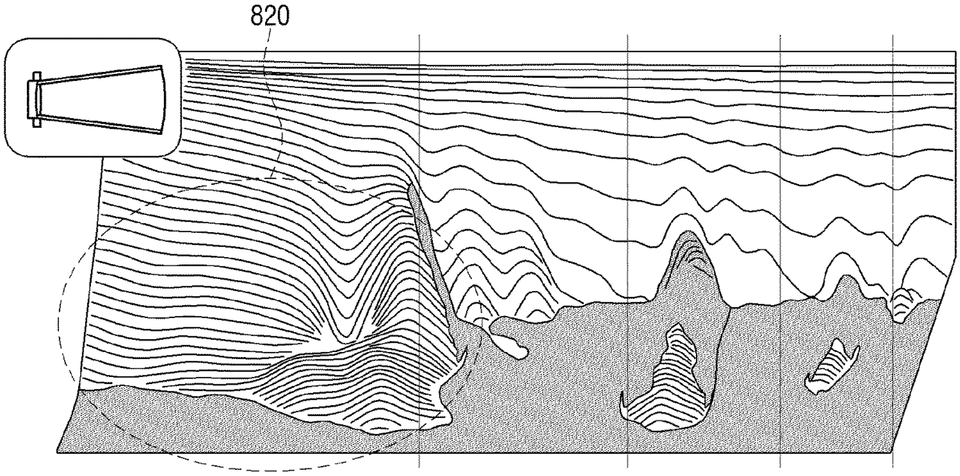

FIGS. 8A and 8B are diagrams for explaining decay characteristics of a midrange speaker and a tweeter including a horn according to an exemplary embodiment.

FIGS. 8A and 8B are graphs illustrating decay characteristics for a frequency domain of 1 to 5 kHz of the midrange speaker and the tweeter including the horn according to an exemplary embodiment.

It may be confirmed that the tweeter including the horn (FIG. 8B) shows the faster decay characteristics than the midrange speaker (FIG. 8A) in a 1 to 2 kHz band shown by a dotted line in FIGS. 8A and 8B. That is, the tweeter has a diaphragm lighter than that of the midrange speaker to generate a small inertia moment, and therefore has fast response characteristics. Accordingly, when the tweeter rather than the midrange speaker is used in the corresponding frequency band, the sound clarity may be improved.

As described above, it is possible to expand the effective frequency domain of the tweeter that reproduces a specific channel based on various characteristics of the horn. That is, by expanding the reproduction band of the tweeter 123 including the horn reproducing the C channel, the multi-crossover may be provided for the C channel as the crossover frequency is formed in the frequency band lower than that of the L/R channels.

Figure 9:
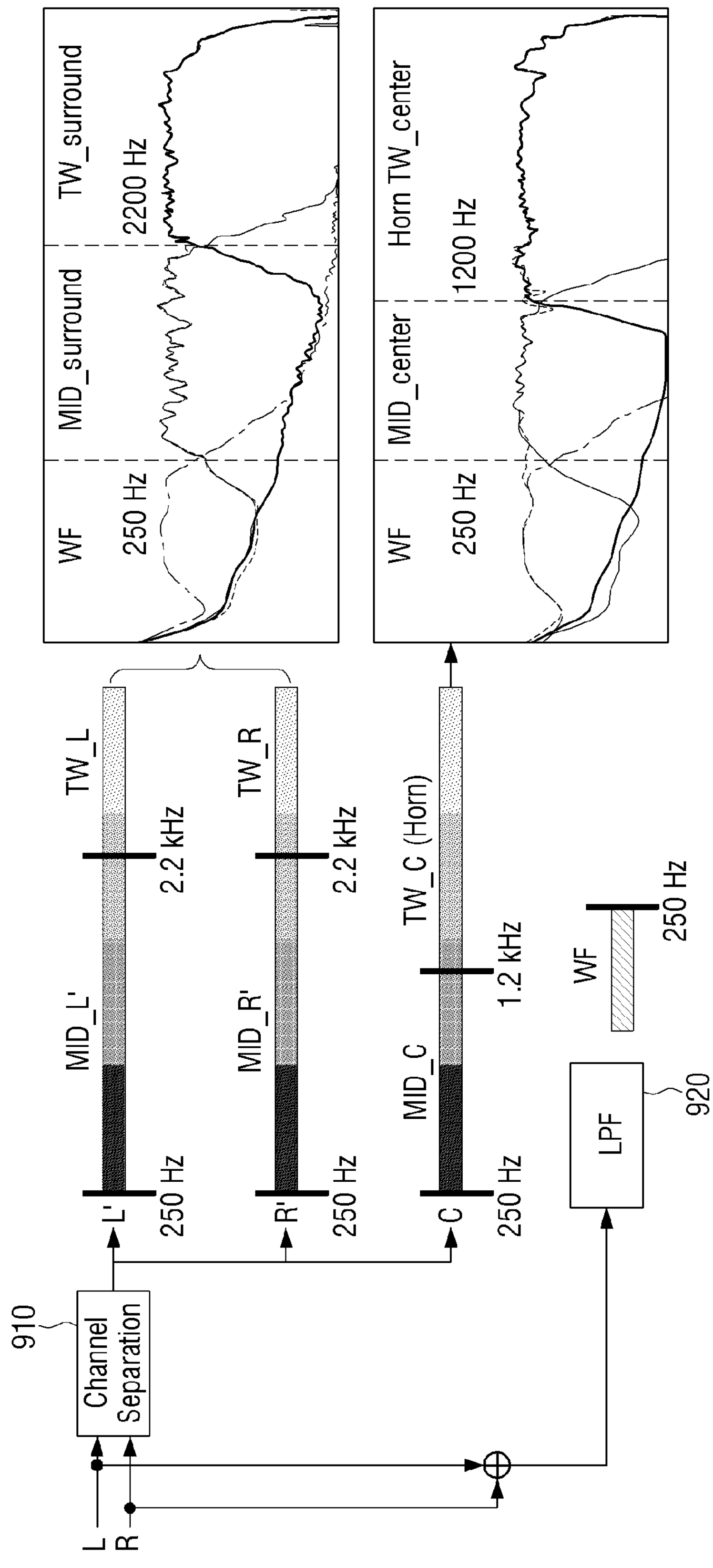
FIG. 9 is a diagram for explaining an example in which a multi-crossover is applied according to an exemplary embodiment.

FIG. 9 is a diagram for explaining an example in which a multi-crossover is applied according to an exemplary embodiment.

As described above, when the speaker unit including the horn is used for one of a plurality of channels, for example, the C channel, as the effective reproduction band in which the tweeter may be used is getting wider due to the characteristics of the horn, the crossover frequency may be formed in the lower frequency band.

For example, as illustrated in FIG. 9, the processor 140 may form a crossover frequency in a frequency band of 2200 Hz in the case of the L/R channels using the tweeter without the horn, whereas the processor 140 may form a crossover frequency in a frequency band of 1200 Hz since the effective reproduction region may be expanded up to 1200 Hz in the case of the C channel using the tweeter including the horn.

According to another exemplary embodiment, the second speaker 121 or 122 reproducing the first channel (for example, L/R channels) and the second speaker 123 reproducing the second channel (for example, C channel) may be implemented as speaker units having the same structure.

That is, the tweeter 123 reproducing the C channel and all of the tweeters 121 and 122 reproducing the L/R channels have the same structure and may be implemented as the typical speaker unit without the horn.

In this case, the processor 140 may control the plurality of crossover circuits 130 to form the first crossover frequency in the fifth frequency band for the L/R channels and the second crossover frequency in the sixth frequency band that is higher than the fifth frequency band for the C channel.

In this case, the processor 140 may control the beam forming for the L, R, and C channels to form the crossover frequency for the L/R channels in the fifth frequency band and the crossover frequency for the C channel in the sixth frequency band that is different from the fifth frequency band.

Specifically, it is effective to form the crossover frequency in different frequency bands, based on a first effective upper bound frequency at which the beam signals corresponding to the L/R channels maintain the preset directivity and a second effective upper bound frequency at which the beam signal corresponding to the C channel maintains the preset directivity. Here, the frequency band in which the crossover frequency for the L/R channels is formed may be a frequency band lower or higher than the frequency band in which the crossover frequency for the C channel is formed.

Hereinafter, a method of providing a multi-crossover using a beam-forming technology will be described in detail with reference to the drawings.

Figure 10A:
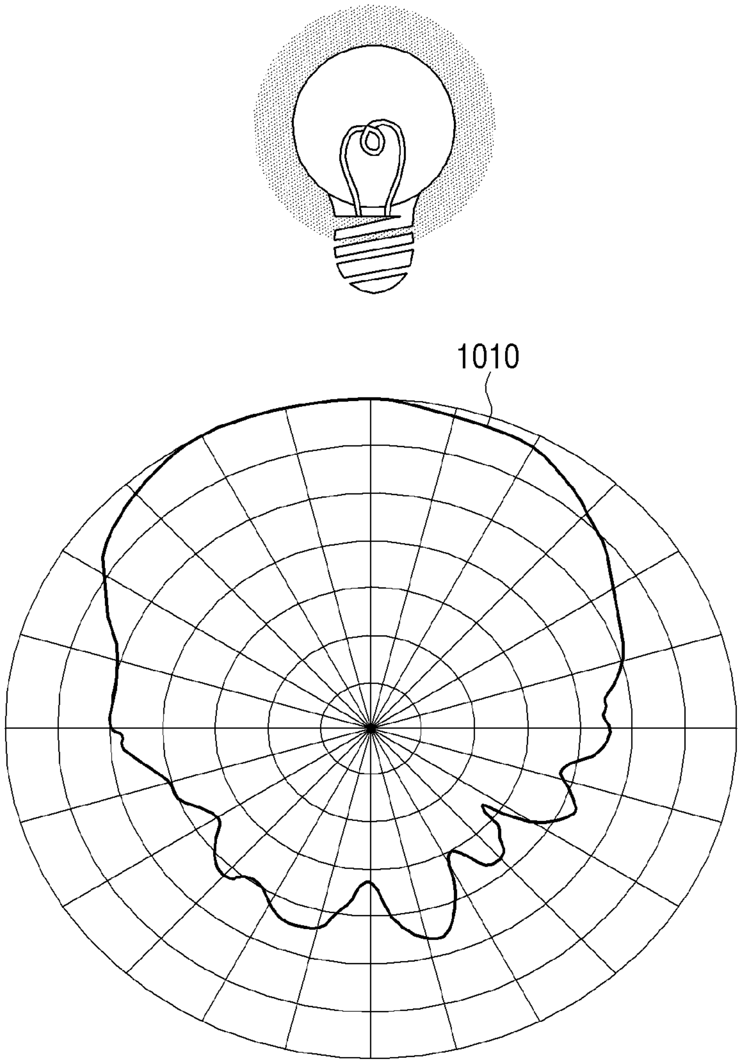
FIGS. 10A, 10B, 10C, 11A and 11B are diagrams for explaining a beam forming technology applied to another exemplary embodiment.
Figure 10B:
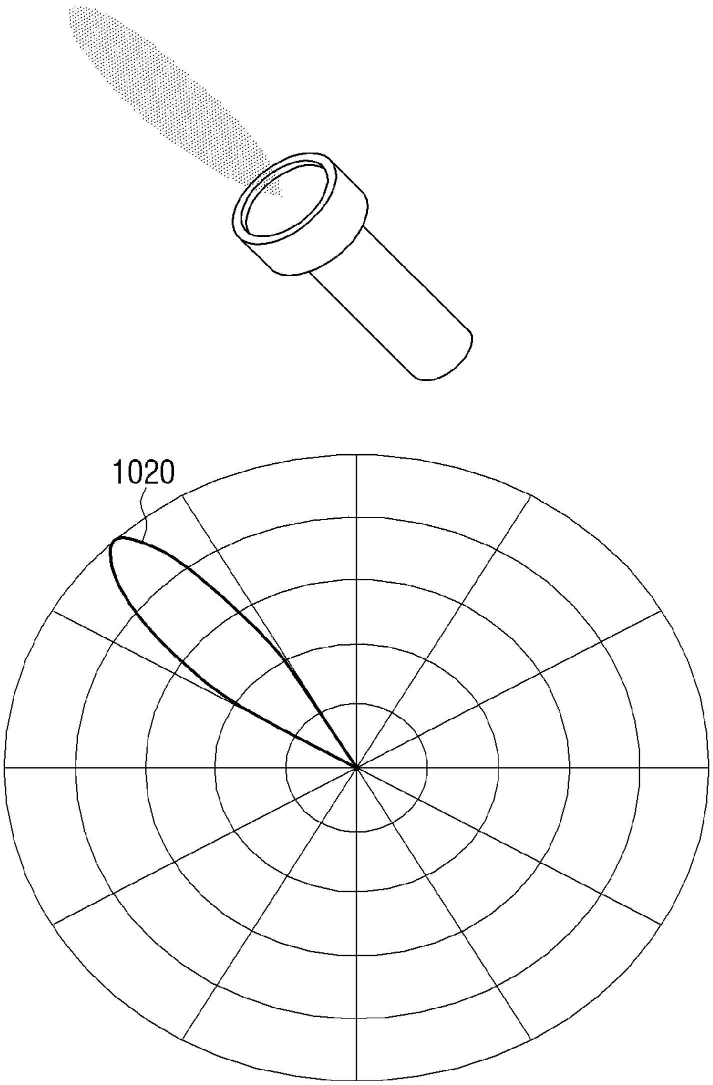
Figure 10C:
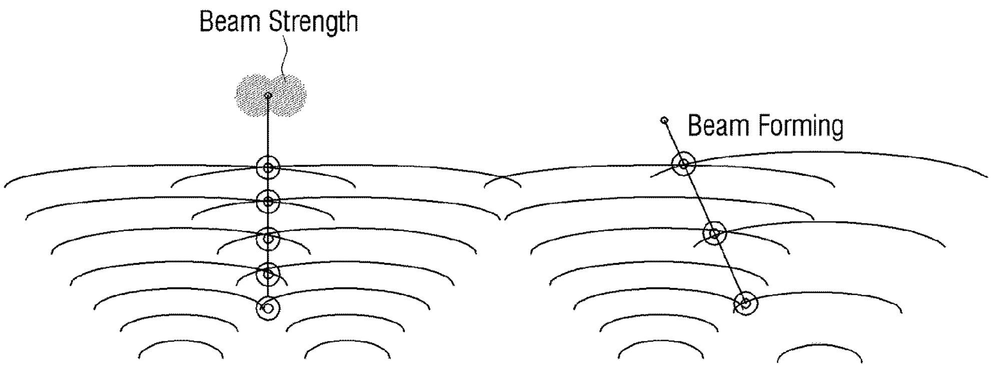

FIGS. 10A to 10C are diagrams for explaining a beam forming technology applied to another exemplary embodiment. In FIGS. 10A and 10B, the beam forming characteristics of the acoustic signal are analogously shown in the form of light in order to help understanding.

As illustrated in FIG. 10A, if one speaker is used, a signal (for example, light in the drawing) in all directions may be spread and radiated, whereas as illustrated in FIG. 10B, the high directivity may be obtained by narrowly radiating the signal in a target direction using the beam forming of the array speaker. By using the beam forming technology as illustrated in FIG. 10B, as illustrated in FIG. 10C, the plurality of speakers use a constructive/destructive interference of a sound to radiate a sound only in a specific direction.

Figure 11A:
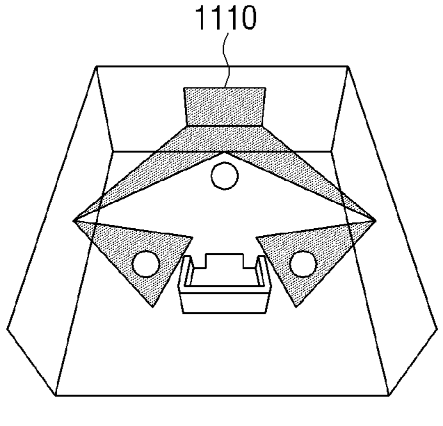
Figure 11B:
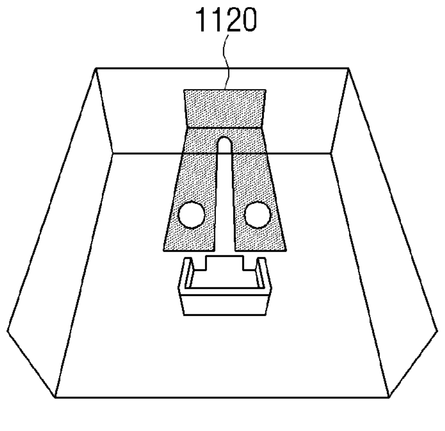

By using the beam-forming technology, a beam 1110 is radiated in the left/right directions as illustrated in FIG. 11A, thereby providing a wide sound field 1110 through a wall reflection of a signal. That is, it is possible to provide a wide sound field unlike the sound field 120 in the case of providing an acoustic signal in a simple stereo form as illustrated in FIG. 11B.

FIGS. 12, 13A, and 13B are diagrams for explaining an operation of an acoustic output device according to another exemplary embodiment.

FIG. 12 is a diagram for explaining the operation of the acoustic output device using the beam forming technology according to another exemplary embodiment which differs from the first exemplary embodiment described above in that all of the tweeters 1221, 1222, and 1223 have the same structure. That is, all of the tweeters 1221, 1222, and 1223 have the same structure and may be implemented as the typical speaker unit without including the directivity structure like the horn.

According to one exemplary embodiment, all of the four midrange speakers 1211, 1212, 1213 and 1214 may reproduce the L channel together with the leftmost tweeter 1221 and the two midrange speakers 1212 and 1213 may reproduce the C channel together with the central tweeter 1222. Further, although not illustrated in FIG. 12, all of the four midrange speakers 1211, 1212, 1213, and 1214 may reproduce the R channel together with the rightmost tweeter 1223.

In this case, the processor 140 may provide the multi-crossover based on a frequency at which the beam forming signals corresponding to each channel maintain the preset directivity, that is, a frequency at which the directivity suitable to provide the sound field expansion effect is maintained.

The processor 140 may control the plurality of crossover circuits 130 to allow each of the second speakers reproducing the first and second channels to reproduce different frequency bands based on the effective upper bound frequency at which each of the beam signals corresponding to the first channel and the second channel maintains preset first and second directivities.

Specifically, the processor 140 may control the plurality of crossover circuits 130 to form the crossover frequency in the first frequency band based on the effective upper bound frequency at which the beam forming signal corresponding to the L channel (or R channel) maintains the specific directivity and form the crossover frequency in the second frequency band based on the effective upper bound frequency at which the beam forming signal corresponding to the C channel maintains the specific directivity.

That is, the processor 140 may control the plurality of crossover circuits 130 to form the crossover frequency in the first frequency band based on the effective upper bound frequency at which the beam forming signals corresponding to the midrange speakers 1211, 1212, 1213, and 1214 reproducing the L channel (or R channel) maintain the specific directivity and form the crossover frequency in the second frequency band based on the effective upper bound frequency at which the beam forming signals corresponding to the midrange speakers 1212 and 1213 reproducing the C channel maintain the specific directivity.

The processor 140 may determine the effective upper bound frequency to maintain the directivity suitable to provide the sound field expansion effect to the L channel (or R channel). Here, the effective upper bound frequency may be, for example, about 2.5 kHz. Therefore, as illustrated in FIG. 13A, the crossover frequency for the L channel (or R channel) may be formed in a band in the vicinity of about 2.5 kHz.

Further, the processor 140 may determine the effective upper bound frequency to maintain the directivity suitable to provide the sound field expansion effect to the C channel. Here, the effective upper bound frequency may be, for example, about 3 kHz. Accordingly, as illustrated in FIG. 13B, the crossover frequency for the C channel may be formed in a band in the vicinity of about 3 kHz.

As described above, the midrange speakers MID_2 1212 and MID_3 1213 simultaneously reproduce at least two channels and have different crossover characteristics in order to provide an appropriate beam forming direction for each channel, thereby providing the multi-crossover.

FIG. 14 is a diagram for explaining a case in which the acoustic output device according to an exemplary embodiment is implemented as a digital TV.

As illustrated in FIG. 14, if an exemplary embodiment is applied to a digital TV, when the C channel is reproduced by the MID_2 speaker and the ambient L/R channels are reproduced by the MID_1, MID_2, and MID_3 speakers to expand the sound field effect, the effective high-range upper bound frequency bands of each channel differ according to beam forming 1410 and 1420 of each channel. In this case, the MID_2 speaker simultaneously reproduces the C channel and the ambient L/R channels and has the multi-crossover since the effective frequency bands of each channel differ, thereby expanding the sound field effect and improving the sound quality.

Figure 4D:
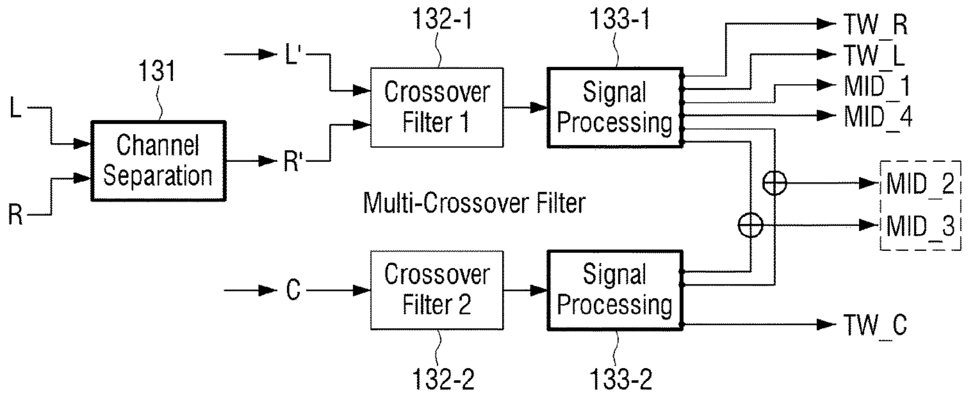

FIG. 4D is a diagram for explaining the detailed operation of the processor according to an exemplary embodiment.

According to FIG. 4D, a channel separation block 131 separates multi-channel audio signals from the input signal. For example, in the case of a 2 channel (L/R) input, it is possible to separate the center and ambient components through the channel separation. However, when the multi-channel signals such as the 5.1 channel and the 7.1 channel are input, they may be directly provided to crossover filter blocks 132-1 and 132-2 for each channel without performing channel separation.

Figure 4E:
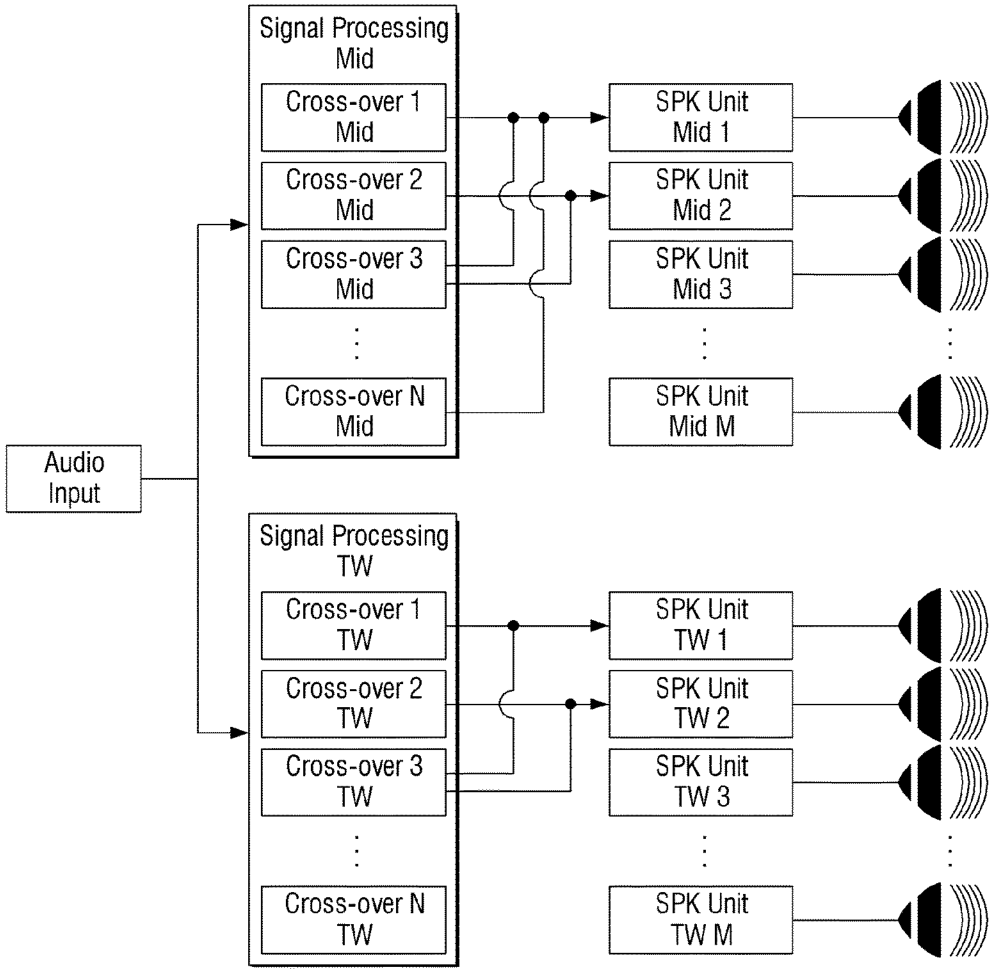

Although not illustrated in FIG. 4D, when an encoded signal is input from the outside, a decoding block that performs decoding may be further provided. For example, if the encoded signal is an SDI signal, the decoding block may convert an encoded SDI signal into parallel digital data. The crossover filter blocks 132-1 and 132-2 divide an audio frequency band by each reproduction range and control a separate speaker unit to reproduce the respective reproduction ranges. The crossover filter blocks 132-1 and 132-2 transmit a specific frequency band to the speaker while blocking other frequency bands. For example, the crossover filter blocks 132-1 and 132-2 transmit a frequency of a high band to the tweeter, a frequency of a midrange to the midrange speaker, and a frequency of a low range to the woofer. The crossover filter block may be implemented to perform the appropriate filtering depending on the number of speakers responsible for each range, as illustrated in FIG. 4E.

The signal processing blocks 133-1 and 133-2 perform various signal processings such as the audio signal amplification.

FIG. 15 is a flow chart for explaining a control method of an acoustic output device according to an exemplary embodiment.

The acoustic output device to which the control method of FIG. 15 is applied is configured to include the at least one first speaker outputting an acoustic signal, the plurality of second speakers outputting a sound range different from that of the first speaker, and the plurality of crossover circuits connected to the first speaker and the plurality of second speakers, respectively.

According to the control method of the acoustic output device illustrated in FIG. 15, when the acoustic signal is input (S1510), for the input acoustic signal, the plurality of crossover circuits are controlled so that the first speaker and the plurality of second speakers each output the signals of at least some different frequency bands (S1520).

Here, the plurality of second speakers may output the acoustic signals of different channels, and at least one first speaker may output the acoustic signals of a plurality of channels corresponding to the plurality of second speakers, respectively. Further, the plurality of second speakers may output the acoustic signals of at least some different frequency bands or output the acoustic signals of the same frequency band.

Further, the plurality of crossover circuits may include the first crossover circuit that is connected to the first speaker and the second speaker responsible for the first channel among the plurality of second speakers to divide the acoustic signals of the first channel by the reproduction range and the second crossover circuit that is connected to the first speaker and the second speaker responsible for the second channel among the plurality of second speakers to divide the acoustic signals of the second channel by the reproduction range. In this case, in operation S1520 of controlling the plurality of crossover circuits, the first and second crossover circuits may be controlled so that the second speaker reproducing the second channel reproduces a frequency band wider (or frequency band narrower) than that of the second speaker reproducing the first channel.

According to an exemplary embodiment, the second speaker reproducing the first channel among the plurality of second speakers and the second speaker reproducing the second channel may be implemented as the speaker units having different structures.

In particular, the second speaker reproducing the second channel may be implemented as the speaker unit including the horn, and the second speaker reproducing the first channel may be implemented as the typical speaker unit without the horn. In this case, in operation S1520 of controlling the plurality of crossover circuits, as the effective frequency band is expanded by the horn provided in the second speaker reproducing the second channel, it is possible to perform a control to allow the second speaker reproducing the second channel to reproduce a frequency band wider than that of the second speaker reproducing the first channel.

Further, in the step S1520 of controlling the plurality of crossover circuits, the first crossover circuit may be controlled to transmit the first frequency band of the first channel to the first speaker and transmit some frequency bands other than the first frequency band to one second speaker of the plurality of second speakers and the second crossover circuit may be controlled to transmit the second frequency band of the second channel to the first speaker and transmit some frequency bands other than the second frequency band to the other second speaker of the plurality of second speakers. In this case, the first frequency band may be a frequency band at least partially different from the second frequency band.

Further, at least one first speaker may be implemented as at least one midrange speaker that outputs the acoustic signal of the intermediate frequency band and the plurality of second speakers may be implemented as the plurality of tweeters that output the acoustic signal of the high frequency band. In this case, in operation S1520 of controlling the plurality of crossover circuits, the first crossover circuit may be controlled to transmit at least one intermediate frequency band of the left (L) and right (R) channels to the first speaker and transmit the high frequency band to one second speaker of the plurality of second speakers and the second crossover circuit may be controlled to transmit the intermediate frequency band of the C channel to the first speaker and transmit the high frequency band to the other second speaker of the plurality of second speakers. In this case, the high frequency band of at least one of the L and R channels may be a frequency band at least partially different from the high frequency band of the C channel.

According to another exemplary embodiment, the second speaker reproducing the first channel among the plurality of second speakers and the second speaker reproducing the second channel may be implemented as the speaker units having the same structure. In this case, in the operation S1520 of controlling the plurality of crossover circuits, the plurality of crossover circuits may be controlled to allow each of the second speakers reproducing the first and second channels to reproduce at least some different frequency bands based on the effective upper bound frequency at which each of the beam signals corresponding to the first channel and the second channel maintains the preset first and second directivities.

According to various exemplary embodiments, the acoustic output device reproducing the plurality of channels using the same speaker unit may form the crossover frequency in different frequency bands by the channel, thereby maximizing the sound field effect and improving the sound quality.

The methods according to various exemplary embodiments as described above may be implemented by upgrading software for the existing acoustic output device.

In addition, various exemplary embodiments as described above may be performed through an embedded server provided in the acoustic output device or a server outside the acoustic output device.

Further, a non-transitory computer readable medium in which a program sequentially performing the control method according to the present disclosure is stored may be provided.

For example, the non-transitory computer readable medium in which a program performing a configuration for allowing the plurality of first speakers and one of the plurality of second speakers to generate the crossover in the first frequency band, for the first channel and some of the plurality of first speakers and the other of the plurality of second speakers to generate a crossover in the second frequency band different from the first frequency band, for the second channel is stored may be provided.

The non-transitory computer readable medium is not a medium that stores data temporarily, such as a register, a cache, and a memory, but means medium that semi-permanently stores data and is readable by a device. In detail, various applications or programs described above may be stored and provided in the non-transitory computer readable medium such as a compact disk (CD), a digital versatile disk (DVD), a hard disk, a Blu-ray disk, a universal serial bus (USB), a memory card, a read only memory (ROM), or the like.

Although exemplary embodiments have been illustrated and described hereinabove, the present disclosure is not limited to the above-mentioned specific exemplary embodiments, but may be variously modified by those skilled in the art to which the present disclosure pertains without departing from the scope and spirit of the disclosure as disclosed in the accompanying claims. These modifications should also be understood to fall within the scope of the present disclosure.

What is claimed is:

1. An acoustic output device comprising:

at least one first speaker configured to output a first sound range;

a plurality of second speakers configured to output a second sound range that is different from the first sound range;

a first crossover circuit connected to the first speaker and one of the plurality of second speakers;

a second crossover circuit connected to the first speaker and another one of the plurality of second speakers, wherein the first and second crossover circuits are audio crossover circuits; and a processor configured to control the first and second crossover circuits to provide acoustic signals to the first speaker and the plurality of second speakers, wherein a frequency band of an acoustic signal provided to the first speaker connected to the first crossover circuit is at least partially different from a frequency band of an acoustic signal provided to the first speaker connected to the second crossover circuit, and wherein a frequency band of an acoustic signal provided to the one of the plurality of second speakers connected to the first crossover circuit is at least partially different from a frequency band of an acoustic signal provided to the other one of the plurality of second speakers connected to the second crossover circuit.

2. The acoustic output device as claimed in claim 1, wherein at least two of the acoustic signals reproduced by the plurality of second speakers are configured to output acoustic signals have different frequency bands.

3. The acoustic output device as claimed in claim 1, wherein the plurality of second speakers are configured to output acoustic signals of different channels.

4. The acoustic output device as claimed in claim 3, wherein the first speaker is configured to output acoustic signals of a plurality of channels corresponding to each of the plurality of second speakers.

5. The acoustic output device as claimed in claim 4, wherein the first crossover circuit is connected to the first speaker and a second speaker among the plurality of second speakers that reproduces a first channel among the plurality of channels, and configured to divide an acoustic signal of the first channel by a reproduction range, and the second crossover circuit is connected to the first speaker and a second speaker among the plurality of second speakers that reproduces a second channel among the plurality of channels, and configured to divide an acoustic signal of the second channel by the reproduction range, and wherein the processor is configured to control the first and second crossover circuits so that the second speaker that reproduces the second channel reproduces a frequency band wider than a frequency band reproduced by the second speaker that reproduces the first channel.

6. The acoustic output device as claimed in claim 4, wherein a second speaker among the plurality of second speakers that reproduces a first channel among the plurality of channels and a second speaker among the plurality of second speakers that reproduces a second channel among the plurality of channels have different structures.

7. The acoustic output device as claimed in claim 6, wherein the second speaker that reproduces the second channel comprises a speaker unit that includes a horn, and the second speaker that reproduces the first channel comprises speaker unit that does not include a horn, and wherein the processor is configured to control the second speaker that reproduces the second channel to reproduce a frequency band that is wider than a frequency band of the second speaker that reproduces the first channel.

8. The acoustic output device as claimed in claim 5, wherein the processor is configured to control the first crossover circuit to provide a first frequency band of the first channel to the first speaker and provide frequency bands other than the first frequency band to the one of the plurality of second speakers, and control the second crossover circuit to provide a second frequency band of the second channel to the first speaker and provide frequency bands other than the second frequency band to the other one of the plurality of second speakers, and the first frequency band is at least partially different from the second frequency band.

9. The acoustic output device as claimed in claim 5, wherein the first speaker comprises a midrange speaker that are configured to output an acoustic signal having an intermediate frequency band, and the plurality of second speakers comprise a plurality of tweeters that are configured to output an acoustic signal having a high frequency band, and wherein the processor is configured to control the first crossover circuit to provide at least one intermediate frequency band of left and right channels to the first speaker and provide a high frequency band to the one of the plurality of second speakers, and control the second crossover circuit to provide an intermediate frequency band of a center channel to the first speaker and provide the high frequency band to the other one of the plurality of second speakers, and the high frequency band of at least one of the left and right channels is at least partially different from the high frequency band of the center channel.

10. The acoustic output device as claimed in claim 4, wherein a second speaker among the plurality of second speakers that reproduces a first channel among the plurality of channels and a second speaker among the plurality of second speakers that reproduces a second channel among the plurality of channels have a same structure, and wherein the processor is configured to control the first crossover circuit and the second crossover circuit so that each of the second speaker that reproduces the first channel and the second speaker that reproduces the second channel reproduce different frequency bands based on an effective upper bound frequency at which each of beam signals corresponding to the first channel and the second channel maintains preset first and second directivities.

11. A control method of an acoustic output device including at least one first speaker configured to output a first sound range, a plurality of second speakers configured to output a second sound range that is different from the first sound range, wherein the first and second crossover circuits are audio crossover circuits, a first crossover circuit connected to the first speaker and one of the plurality of second speakers, and a second crossover circuit connected to the first speaker and another one of the plurality of second speakers, the control method comprising:

receiving an input signal;

controlling the first and second crossover circuits to provide acoustic signals to the first speaker and the plurality of second speakers; and reproducing the acoustic signals by the first speaker and the plurality of second speakers, wherein a frequency band of an acoustic signal provided to the first speaker connected to the first crossover circuit is at least partially different from a frequency band of an acoustic signal provided to the first speaker connected to the second of crossover circuit, and wherein a frequency band of an acoustic signal provided to the one of the plurality of second speakers connected to the first crossover circuit is at least partially different from a frequency band of an acoustic signal provided to the other one of the plurality of second speakers connected to the second crossover circuit.

12. The control method as claimed in claim 11, wherein the acoustic signals reproduced by the plurality of second speakers output have different frequency bands.

13. The control method as claimed in claim 11, wherein the acoustic signals reproduced by the plurality of second speakers are acoustic signals of different channels.

14. The control method as claimed in claim 13, wherein the acoustic signals reproduced by the first speaker are acoustic signals of a plurality of channels corresponding to the plurality of second speakers.

15. The control method as claimed in claim 14, wherein the first crossover circuit is connected to the first speaker and a second speaker among the plurality of second speakers that reproduces a first channel among the plurality of channels to divide an acoustic signal of the first channel by a reproduction range; and the second crossover circuit is connected to the first speaker and a second speaker among the plurality of second speakers that reproduces a second channel among the plurality of channels to divide an acoustic signal of the second channel by the reproduction range, and wherein the controlling of the first and second crossover circuits further comprises controlling the first and second crossover circuits so that a frequency band reproduced by the second speaker that reproduces the second channel reproduces that is wider than a frequency band reproduced by the second speaker that reproduces the first channel.

16. The control method as claimed in claim 15, wherein the second speaker that reproduces the first channel among the plurality of second speakers and the second speaker that reproduces the second channel have different structures.

17. The control method as claimed in claim 16, wherein the second speaker that reproduces the second channel comprises a speaker unit including a horn and the second speaker that reproduces the first channel comprises a speaker unit that does not include the horn, and wherein the controlling of the first and second crossover circuits further comprises controlling the second speaker that reproduces the second channel to reproduce a frequency band wider than a frequency band reproduce by the second speaker that reproduces the first channel.

18. The control method as claimed in claim 15, wherein the controlling the first and second crossover circuits further comprises controlling the first crossover circuit to provide a first frequency band of the first channel to the first speaker and provide frequency bands other than the first frequency band to the one of the plurality of second speakers, and controlling the second crossover circuit to provide a second frequency band of the second channel to the first speaker and provide frequency bands other than the second frequency band to the other one of the plurality of second speakers, and the first frequency band is at least partially different from the second frequency band.

19. The control method as claimed in claim 15, wherein the first speaker comprises a midrange speaker that outputs an acoustic signal of an intermediate frequency band, and the plurality of second speakers comprise a plurality of tweeters that output an acoustic signal of a high frequency band, and the controlling of the first and second crossover circuits further comprises controlling the first crossover circuit to provide at least one intermediate frequency band of left and right channels to the first speaker and provide a high frequency band to the one of the plurality of second speakers, and controlling the second crossover circuit to provide an intermediate frequency band of a center channel to the first speaker and transmit the high frequency band to the other one of the plurality of second speakers, and the high frequency band of at least one of the left and right channels is at least partially different from the high frequency band of the center channel.

20. The control method as claimed in claim 14, wherein a second speaker among the plurality of second speakers that reproduces a first channel among the plurality of channels and a second speaker among the plurality of second speakers that reproduces a second channel among the plurality of channels have a same structure, and the controlling of the first and second crossover circuits further comprises controlling the first crossover circuit and the second crossover circuit so that the second speakers that reproduce the first and second channels reproduce different frequency bands based on an effective upper bound frequency at which each of beam signals corresponding to the first channel and the second channel maintains preset first and second directivities.

* * * * *